(12) United States Patent
Kinnard

(10) Patent No.: US 6,537,419 B1
(45) Date of Patent: Mar. 25, 2003

(54) GAS DISTRIBUTION PLATE ASSEMBLY FOR PROVIDING LAMINAR GAS FLOW ACROSS THE SURFACE OF A SUBSTRATE

(76) Inventor: David W. Kinnard, 4120 Shallow Brook La., Olney, MD (US) 20832

( * ) Notice: Subject to any disclaimer, the term of this patent is extended or adjusted under 35 U.S.C. 154(b) by 0 days.

(21) Appl. No.: 09/558,606

(22) Filed: Apr. 26, 2000

(51) Int. Cl.$^7$ .............................. H05H 1/00; C23C 16/00
(52) U.S. Cl. ............................. 156/345.34; 156/345.33; 156/345.47; 118/723 E
(58) Field of Search .............................. 118/723 E, 715, 118/723 ER; 156/345.47, 345.34, 345.33

(56) References Cited

U.S. PATENT DOCUMENTS

| | | | |
|---|---|---|---|
| 5,212,116 A | * 5/1993 | Yu .............................. | 438/697 |
| 5,449,410 A | 9/1995 | Chang et al. ......... | 118/723 ER |
| 5,558,717 A | * 9/1996 | Zhao et al. .................. | 118/715 |
| 5,653,806 A | 8/1997 | Van Buskirk ............... | 118/715 |
| 5,908,508 A | 6/1999 | Vanell et al. ............. | 118/723 E |
| 5,968,275 A | * 10/1999 | Lee et al. ................ | 118/723 R |
| 6,110,556 A | * 8/2000 | Bang et al. ................ | 428/64.1 |
| 6,155,200 A | * 12/2000 | Horiike et al. ........... | 118/723 E |

FOREIGN PATENT DOCUMENTS

JP  9-232298 A  * 9/1997  ........... H01L/21/31

OTHER PUBLICATIONS

US 5,961,723, 10/1999, Roithner et al. (withdrawn)

* cited by examiner

Primary Examiner—Gregory Mills
Assistant Examiner—P. Hassanzadeh
(74) Attorney, Agent, or Firm—Cantor Colburn LLP

(57) ABSTRACT

A baffle plate assembly (12) is provided for distributing gas flow into an adjacent process chamber cavity (20) containing a semiconductor wafer to be processed. The baffle plate assembly (12) comprises a generally planar upper baffle plate (14) fixedly positioned above a generally planar lower baffle plate (16) and covered by a process chamber top wall (17). The top wall (17) and the lower baffle plate form a plenum therebetween, the plenum operating at a higher pressure than the process chamber cavity (20) during operation of the device, At least the lower baffle plate (16) has a pattern of apertures (30) formed therein for permitting gas to pass therethrough and into the wafer process chamber. The upper baffle plate (16) and the lower baffle plate (14) are positioned generally parallel to each other, and the upper baffle plate (14) is smaller than the lower baffle plate (16). Preferably, the lower baffle plate (14) is comprised of low-alloy anodized aluminum, and the upper baffle plate (16) is comprised of sapphire-coated quartz.

20 Claims, 4 Drawing Sheets

GAS DISTRIBUTION PLATE ASSEMBLY FOR PROVIDING LAMINAR GAS FLOW ACROSS THE SURFACE OF A SUBSTRATE

FIELD OF THE INVENTION

The present invention relates generally to the field of semiconductor plasma processing systems such as photoresist ashers, and more specifically to a gas distribution plate assembly for providing laminar gas flow across the surface of a substrate.

BACKGROUND OF THE INVENTION

In the manufacture of integrated circuits, photolithography techniques are used to form integrated circuit patterns on a substrate, such a silicon wafer. Typically, the substrate is coated with a photoresist, portions of which are exposed to ultraviolet (UV) radiation through a mask to image a desired circuit pattern on the photoresist. The portions of the photoresist left unexposed to the UV radiation are removed by a processing solution, leaving only the exposed portions on the substrate. These remaining exposed portions are baked during a photostabilization process to enable the photoresist to withstand subsequent processing.

After such processing, in which the integrated circuit components are formed, it is generally necessary to remove the baked photoresist from the wafer. In addition, residue that has been introduced on the substrate surface through processes such as etching must be removed. Typically, the photoresist is "ashed" or "burned" and the ashed or burned photoresist, along with the residue, is "stripped" or "cleaned" from the surface of the substrate.

One manner of removing photoresist and residues is by rapidly heating the photoresist-covered substrate in a vacuum chamber to a preset temperature by infrared radiation, and directing microwave-energized reactive gases (i.e., a plasma) toward the heated substrate surface. In the resulting process, the reactive plasma reacts with the photoresist to ash it for subsequent removal from the wafer.

It is important that the ashing process occur at substantially the same rate across the surface of the wafer. To insure such uniform ashing of the photoresist, the process conditions must be precisely controlled. Process conditions that must be so controlled include the temperature of the process chamber and the temperature of the wafer.

Known gas distribution or baffle plates for directing energized plasma toward a wafer are typically made of quartz, due to their ability to withstand high process temperatures. However, the use of quartz makes acceptable wafer and process temperature uniformity difficult to obtain. The temperature non-uniformities are caused by the large temperature gradients that can develop across the surface of a quartz plate due to its poor thermal conductivity characteristics. In addition, undesirable infrared (IR) wavelength absorption characteristics of quartz add to the thermal energy absorbed by the baffle plate. As a result, process uniformity and system throughput are adversely affected.

In addition to precise temperature control, the energized plasma that reacts with the photoresist must be evenly distributed across the wafer while a constant gas flow rate is maintained. Known baffle plates such as that shown U.S. Pat. No. 5,449,410 to Chang et al. distribute energized gases into the process chamber by means of a configuration that includes perimetric apertures but no apertures near the center (see FIG. 2 of Chang). However, known baffle plates such as that shown suffer from an inability to evenly distribute gas across the surface of the wafer in a laminar flow-like manner, especially when high gas flow rates are provided to achieve corresponding high process rates.

Thus, it is an object of the present invention to provide a mechanism for enabling a laminar flow of energized gas across the surface of a substrate being processed in a plasma processing system. The flow of gas is such that reactive species are supplied to the surface of the wafer in a manner that provides a uniform reaction rate even at high gas flow rates. This is achieved by providing a ratio of laminar jet center velocity to jet expansion such that a uniform mass flow rate per unit area is provided to the surface of the wafer. In addition, the supply of reactive species to the surface of the wafer allows for the generation of reaction effluent emanating from the surface of the wafer as the reaction occurs. It is a further object of the invention to improve wafer-to-wafer process uniformity in such a system. It is still a further object of the invention to provide a mechanism for minimizing temperature gradients across the wafer by providing a relatively flat temperature profile, across the surface of a gas distribution or baffle plate in such a system.

SUMMARY OF THE INVENTION

A baffle plate assembly is provided for distributing gas flow into an adjacent process chamber containing a semiconductor wafer to be processed. The baffle plate assembly comprises a generally planar upper baffle plate fixedly positioned above a generally planar lower baffle plate. A plenum is formed between the lower baffle plate and the process chamber lid or top wall. The lower baffle plate is sealed to the process chamber, and the process chamber top wall is attached to the lower baffle plate, creating a region of higher pressure in this plenum (as compared to the process chamber pressure). At least the lower baffle plate has a pattern of apertures formed therein for permitting gas to pass therethrough and into the wafer process chamber. The upper baffle plate and the lower baffle plate are positioned generally parallel to each other, and the upper baffle plate is smaller than the lower baffle plate. Preferably, the lower baffle plate is comprised of low-alloy anodized aluminum, and the upper baffle plate is comprised of sapphire-coated quartz.

In a 300 millimeter (mm) embodiment, the apertures in the lower baffle plate are arranged in a pattern such that each aperture is equidistant from any adjacent aperture. The upper baffle plate is provided with slightly larger apertures formed therein in a concentric multiply circular (radial) pattern. The upper baffle plate is also provided with a centrally located impingement plate. In a 200 mm embodiment, the apertures in the lower baffle plate arranged in a concentric multiply circular (radial) pattern, and the upper baffle plate is apertureless.

DETAILED DESCRIPTION OF A PREFERRED EMBODIMENT

Figure 1:
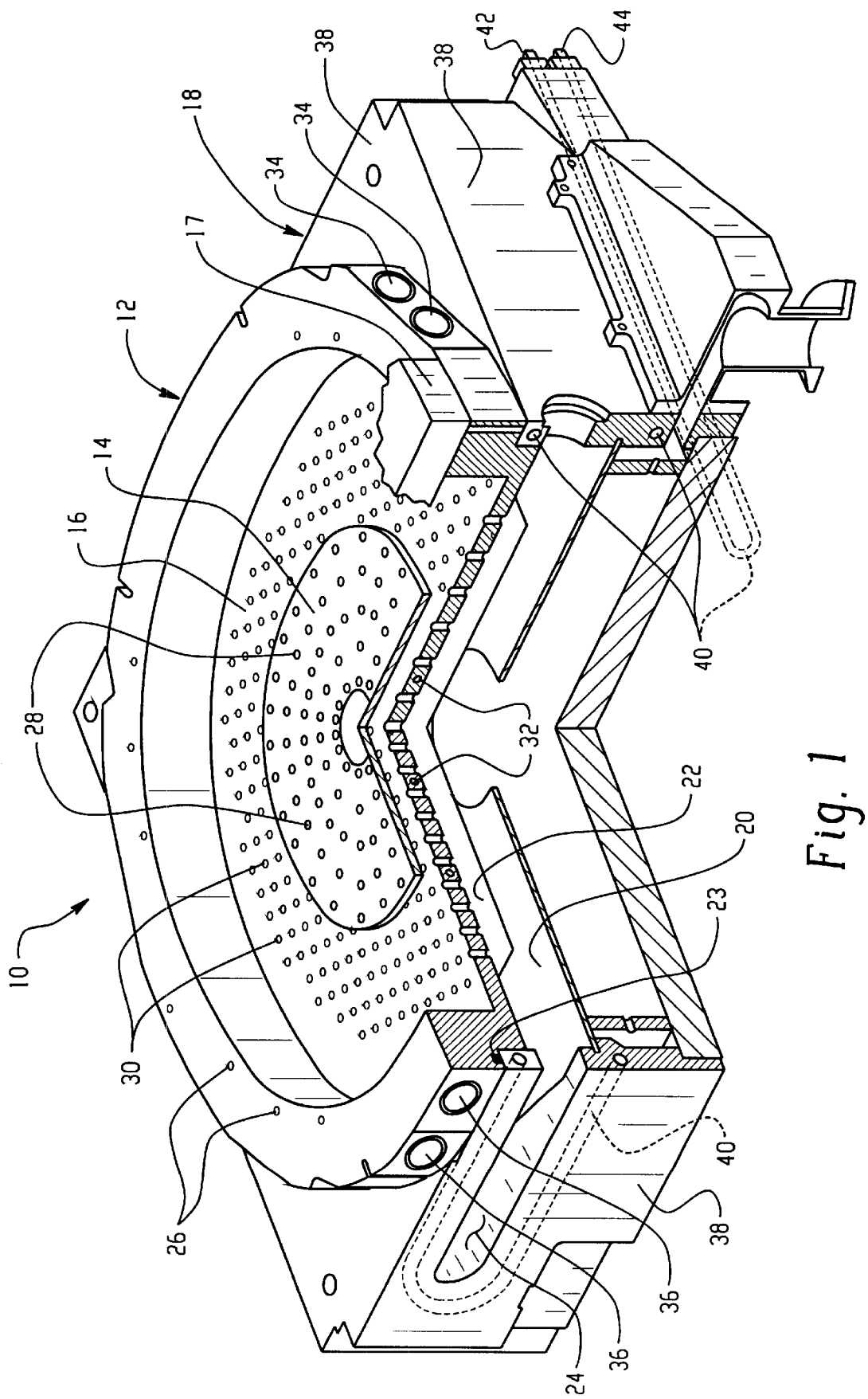
FIG. 1 is a partial cutaway, perspective view of a photoresist asher process chamber into which is installed a first embodiment of a baffle plate assembly constructed according to the present invention.

Referring now to the drawings, FIG. 1 shows an asher process chamber 10 into which is incorporated a first embodiment of a gas distribution or baffle plate assembly 12. The asher process chamber 10 having the baffle plate assembly 12 installed therein is suitable for use in a 300 millimeter (mm) wafer processing system. Although the present invention is shown as being implemented within a photoresist asher, it may also be used in other semiconductor manufacturing equipment, such as residue removal, stripping, and isotropic etching equipment.

The baffle plate assembly 12 comprises an upper apertured baffle plate 14 and a relatively larger lower apertured baffle plate 16 positioned generally parallel to each other and separated from one another. The baffle plate assembly is attached to a lower portion 18 of the process chamber that includes a cavity 20 in which a wafer 22 to be processed is placed. The baffle plates 14 and 16, in addition to being oriented parallel to each other, are also oriented parallel to the wafer being processed.

Figure 2:
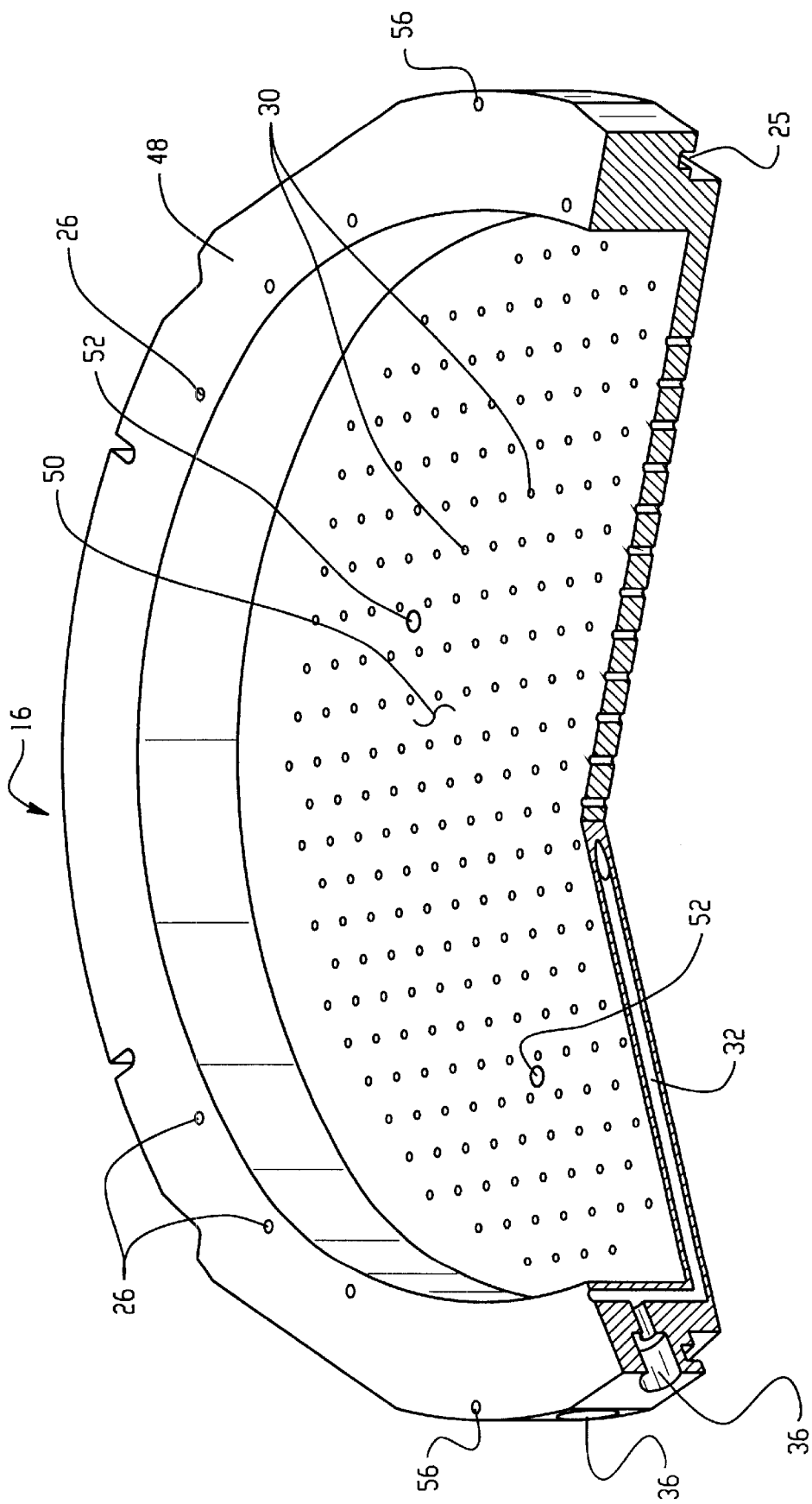
FIG. 2 is a partial cutaway, perspective view of the lower baffle plate portion of the baffle plate assembly of FIG. 1, shown in its water-cooled embodiment.

A seal 23 is provided at the interface between the baffle plate assembly 12 and the upper portion 18 of the process chamber, and resides within groove 25 in the lower baffle plate 16 (see FIG. 2). Wafers are introduced into and removed from the process chamber via a load lock mechanism (not shown) via entry/exit passageway 24. A heater mechanism (not shown), located under the lower portion 18 of the process chamber, heats the underside of the wafer to a desired temperature during processing.

The asher process chamber 10 of FIG. 1 is typically installed within an asher intermediate the heater assembly (below) and a plasma tube assembly (above, not shown) at the locations of holes 26. The plasma tube is typically made of alumina ($Al_2O_3$) or sapphire to accommodate fluorine chemistries without etching or other degradation. In operation, a desired mixture of gases is introduced into the plasma tube from a gas box.

One example of a desired gas mixture is forming gas (primarily nitrogen with a small percentage of hydrogen), and oxygen. A fluorine-containing gas such as carbon tetrafluoride ($CF_4$) may be added to the gas mixture to increase ashing rates for certain processes. The desired gas mixture is energized in the plasma tube by a microwave power generator assembly to form a reactive plasma that will ash photoresist on a wafer residing in the process chamber cavity 20. Energized plasma typically leaves the plasma tube and is directed into the process chamber 10 at approximately an atmospheric pressure of 1.6 torr and a temperature of about 150° C. Typically there is a drop in pressure along the length of the plasma tube which directs the plasma downward through the tube and toward the process chamber 10.

The energized plasma (gas) leaving the plasma tube encounters the baffle plate assembly 12. The plasma is distributed into the process chamber cavity 20 via apertures 28 in the upper baffle plate 14 and apertures 30 in the lower baffle plate 16. The lower baffle plate 16 may be actively cooled with a cooling medium flowing through internal cooling passages 32 via inlets 34 and outlets 36 (see also FIG. 2). The walls 38 of the lower portion 18 of the process chamber may also be actively cooled with a cooling medium flowing through internal cooling passages 40 via inlet 42 and outlet 44.

The lower baffle plate 16, as shown in the partial cutaway, perspective view of FIG. 2, comprises an outer flange 48 and a generally planar portion 50 which contains the apertures 30. Mounting holes 52 are provided in the lower baffle plate 16 for mounting the upper baffle plate 14 thereto by means of standoffs 54 (shown in FIGS. 4 and 6). The distance between the upper and lower baffle plates in part determines the pattern of gas flow through the baffle plate assembly 12.

Figure 3:
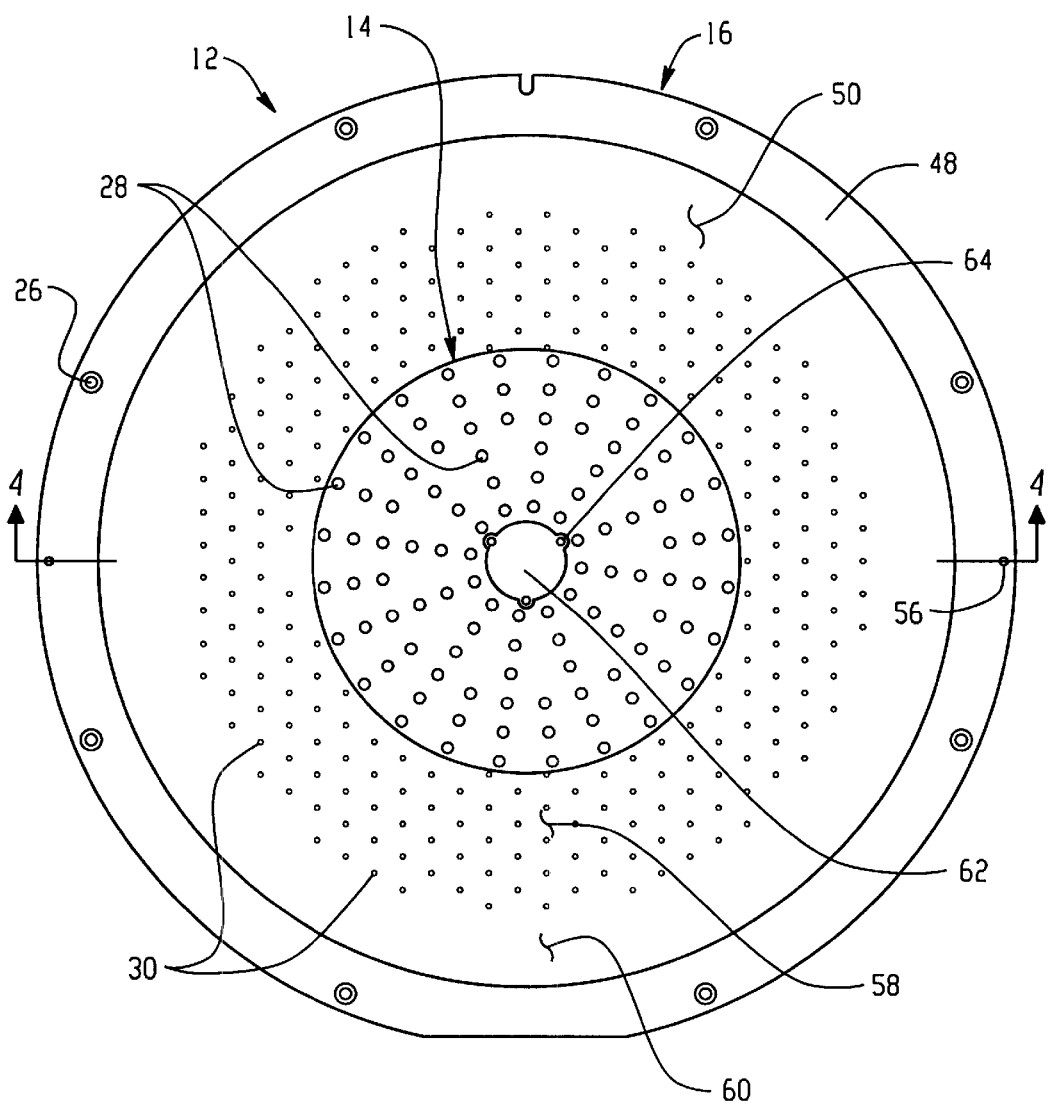
FIG. 3 is a plan view of the baffle plate assembly shown in FIG. 1, shown in its water-cooled embodiment.
Figure 4:
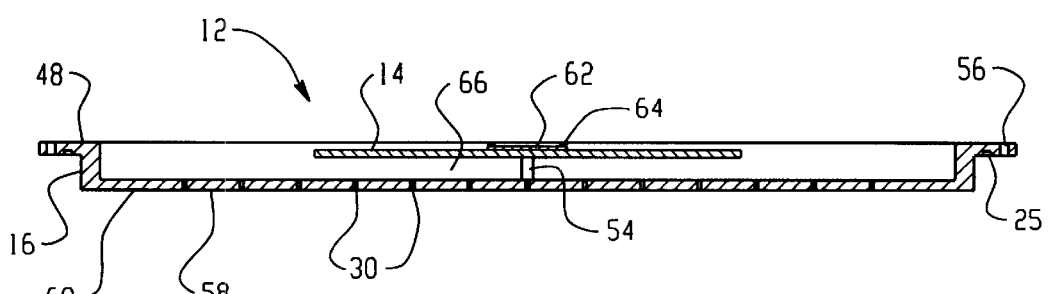
FIG. 4 is a sectional view of the baffle plate assembly of FIG. 3, taken along the lines 4—4.

FIG. 3 is a plan view of the 300 mm baffle plate assembly shown in FIG. 1, and FIG. 4 is a sectional view of this embodiment of the baffle plate assembly. As shown in these Figures, the baffle plate assembly is mounted to the upper portion 18 of the process chamber via mounting holes 56 in the lower baffle plate flange 48. The generally planar portion 50 of the lower baffle plate 14 includes a radially inner portion 58 and a radially external portion 60.

Apertures 30 are provided in the radially inner portion 58 of the lower baffle plate but not in the radially external portion 60. The apertures 30, although shown only partially covering the radially internal portion 58, actually cover the entirety of this inner portion (see FIG. 2). The surface area of the radially inner portion 58 is sufficient to cover the wafer 22 residing therebelow (see FIG. 1). The apertures are positioned equidistant from each other in all directions. That is, any three apertures which are mutually immediately adjacent to each other form an equilateral triangle.

The apertures 28 in the upper baffle plate 16 are arranged in a radial (or concentric multiply circular) pattern. The upper baffle plate is comprised of sapphire-coated fused silica or quartz ($SiO_2$). The apertures 28 in the upper baffle plate 16 are slightly larger than the apertures 30 in the lower baffle plate 14. Located at the center of the upper baffle plate is a sapphire impingement plate 62, which is attached to the upper baffle plate using screws 64. The sapphire impingement plate 62 diverts energized gases emanating from the plasma tube radially outward to the remaining apertured area of the upper baffle plate 16, so as to prevent the radially inward potion of the wafer 22 being processed from overheating.

Figure 5:
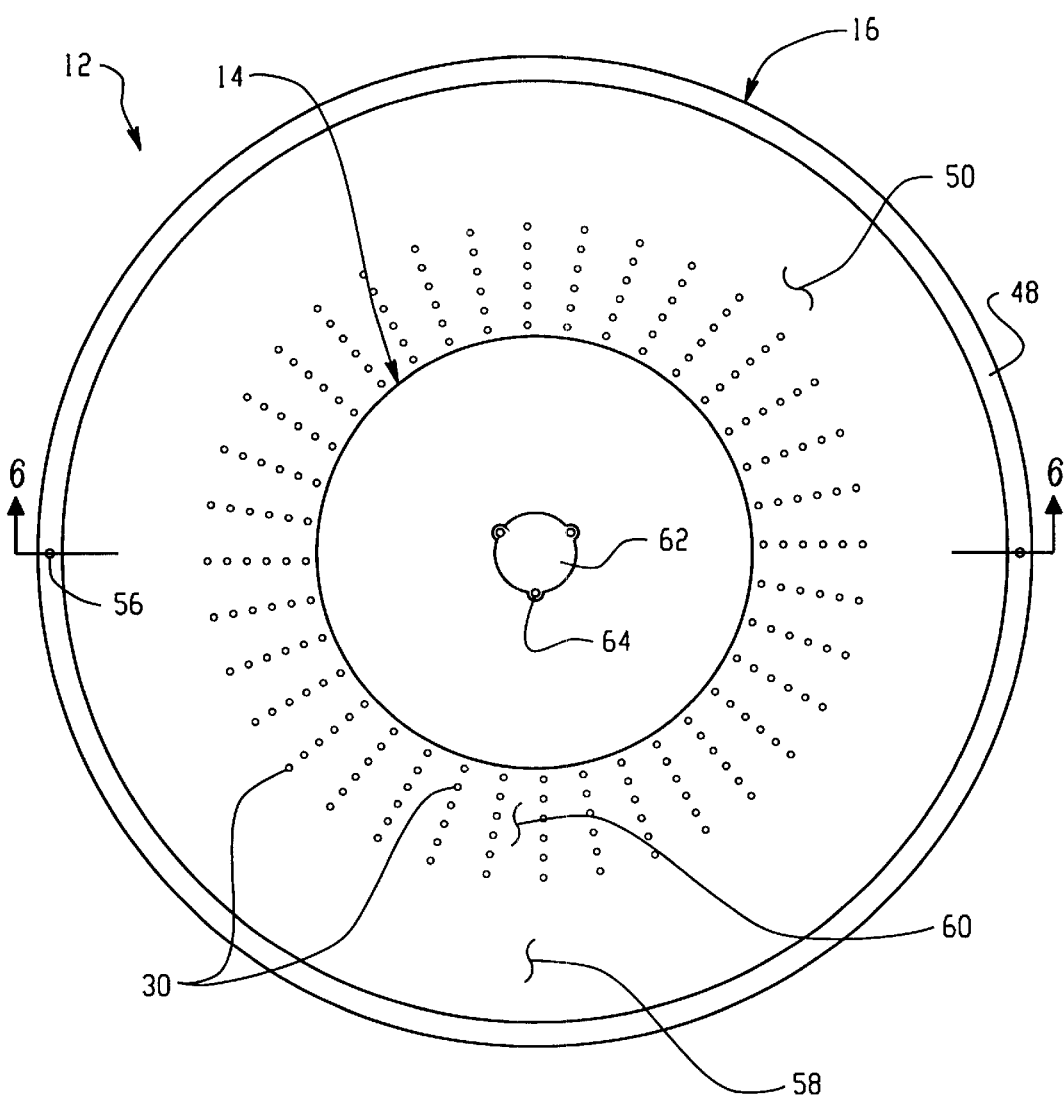
FIG. 5 is a plan view of a second embodiment of a baffle plate assembly constructed according to the present invention, which is installable into the photoresist asher process chamber of FIG. 1.
Figure 6:
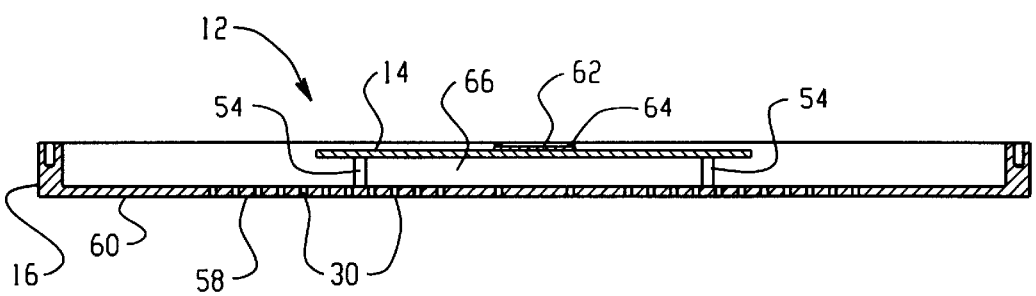
FIG. 6 is a sectional view of the baffle plate assembly of FIG. 5, taken along the lines 6—6.

FIGS. 5 and 6 show a second embodiment of the baffle plate assembly 12, which is installable into the photoresist asher process chamber of FIG. 1 for 200 mm wafer process applications. In this second embodiment, the lower baffle plate 14 has apertures 30 formed in the radially inner portion 58 in a radial (or concentric multiply circular) pattern. The surface area of the radially inner portion 58 is sufficient to cover the wafer 22 residing in the process chamber therebelow.

In the 200 mm embodiment of the present invention of FIGS. 5 and 6, the upper baffle plate 16 is apertureless. The centrally located sapphire impingement plate 62 remains in this embodiment. The upper baffle plate in this embodiment, like the 300 mm embodiment, is comprised of a sapphire-coated fused silica (quartz).

The lower baffle plate 14, in either the 200 mm or 300 mm embodiments, is preferably formed from a single piece of low-alloy anodized aluminum (e.g., Alcoa type C-276), which significantly improves the heat transfer characteristics and corrosion resistance of the baffle plate over known quartz baffle plates. The use of aluminum also permits the cooling passages to be drilled or machined directly therein, thereby making the baffle plate less sensitive to inconsistencies in the heating system, and allows the process occurring on the surface of the wafer to take place at a substantially uniform temperature. The use of aluminum also blocks a large percentage of ultraviolet (UV) energy emanating from the heating system that would otherwise make temperature control more difficult and possibly cause wafer device damage.

In either of its 200 mm or 300 mm embodiments, the baffle plate assembly 12 of the present invention evenly distributes the reactive plasma received from the plasma tube across the surface of the wafer 22 being processed to achieve desired process results. The inventive baffle plate assembly enhances the uniformity of plasma ions and radical densities that pass across the wafer surface during processing, providing for improved process uniformity while maintaining high wafer throughput rates. The design of the individual baffle plates and of the baffle plate assembly is determined by applied gas dynamics, materials engineering, and process data to insure correct pressure, gas flows and temperature gradients within the process chamber. The baffle plate assembly is compact, requiring less than one inch vertical space within the process chamber 10.

The baffle plate assembly construction, together with an incremental pressure drop from just above the upper baffle plate 16 to just below the lower baffle plate 14, helps create a laminar flow of gas which is distributed across the upper surface of the wafer 22 being processed. The baffle plate assembly 12 minimizes the mass flow rate gradient per unit area across the surface of the lower baffle plate in a direction normal to the surface of the plate. This is accomplished by combining the effects of radial pressure drop between the upper plate and the process chamber top wall 17 (see FIG. 1), between the upper and lower plates, and the effect of the pressure drop across the plane defined by the lower baffle plate. The effect is to provide a uniform distribution of reactive species to the surface of the wafer and to allow for the generation of reaction effluent emanating from the surface of the wafer as the reaction takes place. The combination of the sapphire-coated quartz upper plate 16 and the aluminum lower plate 14 in the baffle plate assembly 12 has been found to be suitable for use in the harsh conditions found in a process chamber used for photoresist removal, even when corrosive gases such as $CF_4$ are utilized.

The baffle plate assembly functions in operation as follows. Energized gas output from the end of the plasma tube (at approximately 1.6 torr) flows at a rate of about 5–7 litres per minute (lpm). The sapphire impingement plate 62 on the upper baffle plate 16 first functions to distribute reactive gases radially outward, causing a radial pressure drop. Radial pressure drop is a function of the spacing between the upper and lower baffle plates, the size and pattern of apertures in these plates, and the size and shape of these plates. The upper baffle plate 16 also protects the lower baffle plate 14 from damage by the plasma.

The pressure at the surface of the impingement plate 62 and the upper baffle plate 16 is approximately 1.5 torr. The pressure of the area 66 between the upper and lower baffle plates is approximately 1.2–1.3 torr. The pressure below the lower baffle plate 4, within the process chamber cavity 20 on the order of 1.0 torr. This incremental pressure drop from the plasma tube exit to the process chamber cavity 20 insures a downward flow of gas, and the baffle plate assembly construction imparts a laminar flow characteristic to this downwardly flowing gas.

The incremental vertical pressure drop is a function of the number and size of the apertures in the upper and lower baffle plates, the aperture location, and the assembly geometry. Because the pressure drop across the lower baffle plate is known a maximum 5% ashing rate non-uniformity has been achieved across the surface of an ashed wafer processed by the inventive baffle plate assembly.

Accordingly, a preferred embodiment of a gas distribution plate assembly for providing a laminar gas flow across the surface of a substrate in a plasma processing system has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. A plasma processing chamber (10) for processing a semiconductor wafer contained therein, comprising:
    (i) a wafer processing cavity (20) into which a wafer may be inserted for processing, the wafer processing cavity defined in part by walls (38) including a top wall (17); and
    (ii) a baffle plate assembly (12) located adjacent said wafer processing cavity for distributing energized gas thereinto, said baffle plate assembly comprising a generally planar upper baffle plate (14) fixedly positioned above a generally planar lower baffle plate (16), said upper baffle plate being smaller than said lower baffle plate so as to form a plenum between said top wall (17) and said lower baffle plate (16); said upper baffle plate (14) being provided with a central portion (62) that is apertureless surrounded by apertures (28) formed therein for permitting gas to pass therethrough to said lower baffle plate; said plenum operating at a higher pressure than said processing cavity (20) during operation of the chamber (10); said lower baffle plate (16) having a pattern of apertures (30) formed therein for permitting gas to pass therethrough from said plenum and into said wafer processing cavity.

2. The plasma processing chamber (10) of claim 1, wherein said upper baffle plate (16) and said lower baffle plate (14) are positioned generally parallel to each other and to the wafer being processed in cavity (20).

3. The plasma processing chamber (10) of claim 2, wherein said lower baffle plate (14) is comprised of low-alloy anodized aluminum.

4. The plasma processing chamber (10) of claim 3, wherein said upper baffle plate (16) is comprised of quartz.

5. The plasma processing chamber (10) of claim 4, wherein said upper quartz baffle plate (16) is coated with sapphire.

6. The plasma processing chamber (10) of claim 2, wherein the chamber (10) is adapted to receive a wafer having a diameter of approximately 300 millimeters (mm).

7. The plasma processing chamber (10) of claim 6, wherein said apertures (30) in said lower baffle plate (14) are arranged in a pattern such that each aperture (30) is equidistant from any adjacent aperture.

8. The plasma processing chamber (10) of claim 6, wherein said upper baffle plate apertures (28) are larger in size than said lower baffle plate apertures (30).

9. The plasma processing chamber (10) of claim 8, wherein said upper baffle plate apertures (28) are formed in a concentric multiply circular pattern.

10. The plasma processing chamber (10) of claim 2, wherein the chamber (10) is adapted to receive a wafer having a diameter of approximately 200 millimeters (mm).

11. The plasma processing chamber (10) of claim 10, wherein said apertures (30) in said lower baffle plate (14) are arranged in a concentric multiply circular pattern.

12. A baffle plate assembly (12) for distributing gas flow into an adjacent process chamber containing a semiconductor wafer to be processed, comprising:

a generally planar upper baffle plate (14) fixedly positioned above a generally planar lower baffle plate (16), said upper and lower baffle plates forming an area (66) therebetween; said upper baffle plate (14) being smaller than said lower baffle plate and being provided with a central portion (62) that is apertureless surrounded by apertures (28) formed therein for permitting gas to pass therethrough to said lower baffle plate; said lower baffle plate (16) having a pattern of apertures (30) formed therein for permitting gas to pass therethrough and into the wafer process chamber.

13. The baffle plate assembly (12) of claim 12, wherein said upper baffle plate (16) and said lower baffle plate (14) are positioned generally parallel to each other.

14. The baffle plate assembly (12) of claim 13, wherein said lower baffle plate (14) is comprised of low-alloy anodized aluminum.

15. The baffle plate assembly (12) of claim 14, wherein said upper baffle plate (16) is comprised of quartz.

16. The baffle plate assembly (12) of claim 15, wherein said upper quartz baffle plate (16) is coated with sapphire.

17. The baffle plate assembly (12) of claim 13, wherein said apertures (30) in said lower baffle plate (14) are arranged in a pattern such that each aperture (30) is equidistant from any adjacent aperture.

18. The baffle plate assembly (12) of claim 13, wherein said upper baffle plate apertures (28) are larger in size than said lower baffle plate apertures (30).

19. The baffle plate assembly (12) of claim 18, wherein said upper baffle plate apertures (28) are formed in a concentric multiply circular pattern.

20. The baffle plate assembly (12) of claim 13, wherein said apertures (30) in said lower baffle plate (14) are arranged in a concentric multiply circular pattern.

* * * * *